Figure 1:
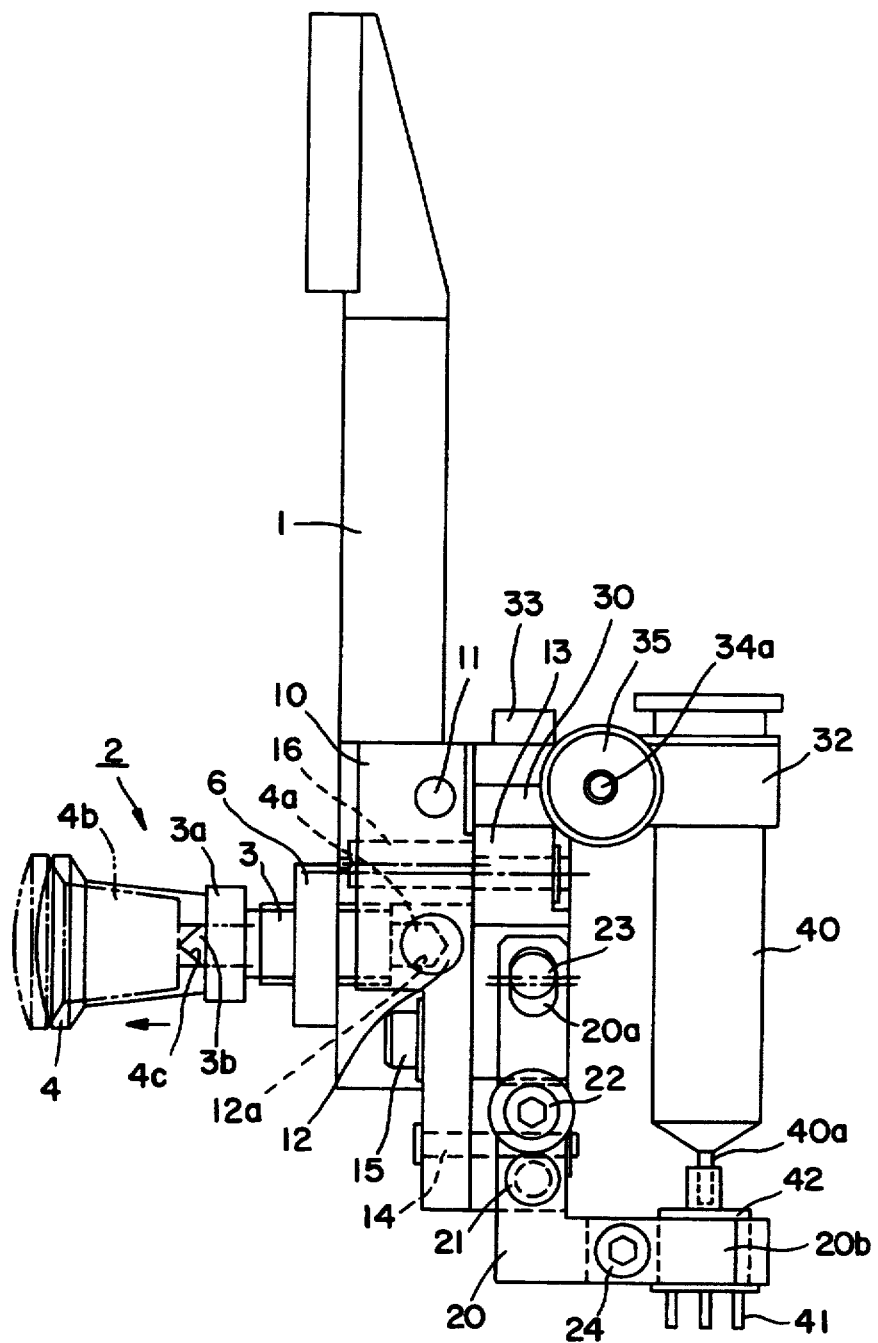
Figure 2:
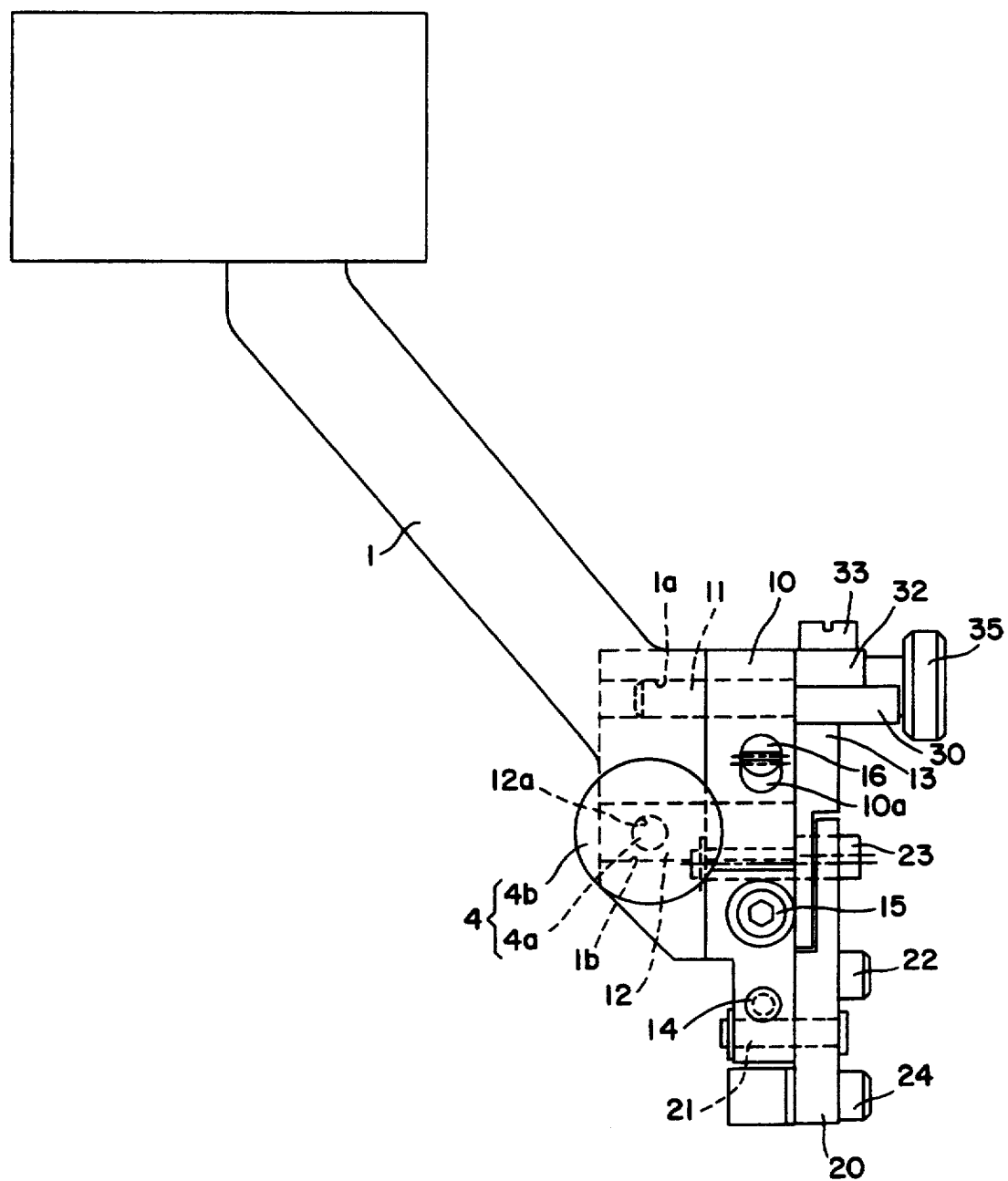
Figure 3:
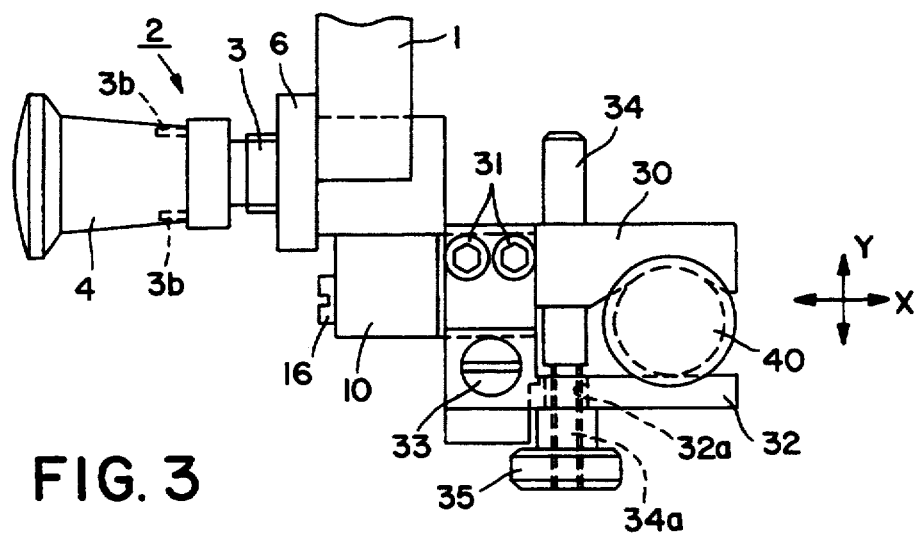
Figure 4:
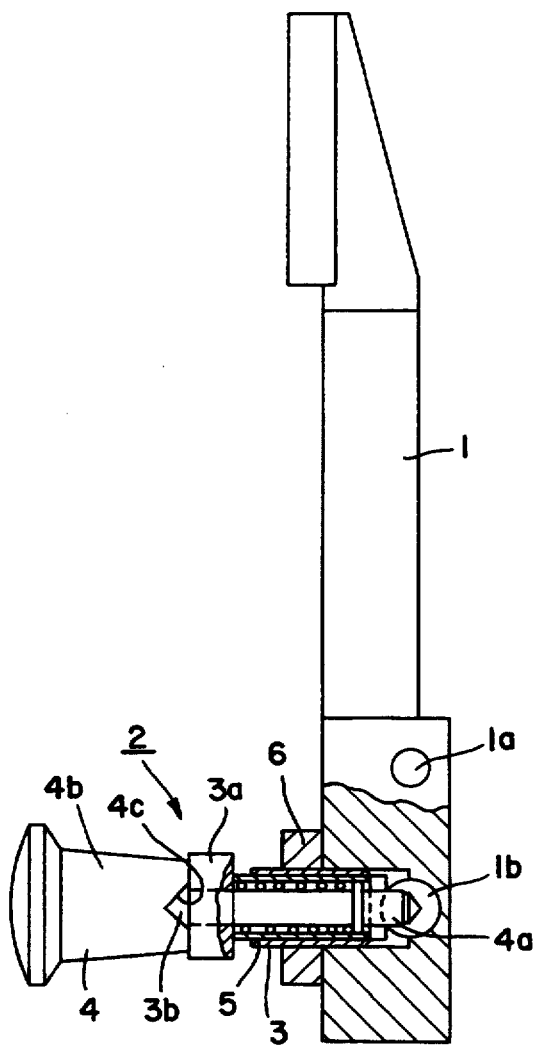

United States Patent [19]

Suzuki

[11] Patent Number: 5,372,343
[45] Date of Patent: Dec. 13, 1994

[54] SYRINGE HOLDER ATTACHMENT STRUCTURE

[75] Inventor: Kohei Suzuki, Tokyo, Japan

[73] Assignee: Kabushiki Kaisha Shinkawa, Tokyo, Japan

[21] Appl. No.: 54,446

[22] Filed: Apr. 27, 1993

[30] Foreign Application Priority Data

Apr. 27, 1992 [JP] Japan .................................. 4-134277

[51] Int. Cl.⁵ .......................................... F16M 11/00
[52] U.S. Cl. ..................................... 248/200; 156/578
[58] Field of Search ................. 248/200, 221.3, 222.1, 248/224.3, 187, 316.1, 220.2, 913; 156/578, 575; 118/407

[56] References Cited

U.S. PATENT DOCUMENTS

| | | | |
|---|---|---|---|
| 1,246,749 | 11/1917 | Joiner | 248/221.3 |
| 3,834,966 | 9/1974 | Kelly . | |
| 3,999,055 | 12/1976 | Wakahara et al. | 362/3 X |
| 4,240,129 | 12/1980 | Kawazoe | 248/221.3 X |
| 4,437,585 | 3/1984 | Banks | 248/221.3 X |

Primary Examiner—Blair M. Johnson
Attorney, Agent, or Firm—Koda and Androlia

[57] ABSTRACT

A quick and easy mounting and dismounting of a syringe holder to and from a syringe holder mount of a dispensing device of, for example, a bonding machine is accomplished by a combination of a locking member of the syringe holder mount and an engagement recess of one of two attachment pins of the syringe holder. The locking member is urged, via a spring force and at right angles, towards one of two attachment holes formed in the syringe holder mount. The two attachment pins are inserted into the attachment holes of the syringe holder mount when the syringe holder is mounted, and the tip end of the locking member is brought, via the spring force, to engage with the engagement recess of the attachment pin, thus retaining the syringe holder on the syringe holder mount. When dismounting the syringe holder from the mount, the locking member is pulled, thus releasing the engagement between the tip end of the locking member and the engagement recess of the attachment pin.

4 Claims, 3 Drawing Sheets

SYRINGE HOLDER ATTACHMENT STRUCTURE

BACKGROUND OF THE INVENTION

1. Field of the Invention

The present invention relates to a syringe holder attachment structure usable in, for example, dispenser devices.

2. Prior Art

When bonding semiconductor pellets to lead frames, a paste is dropped onto the lead frames by a dispenser, and with a use of a die bonding device, the semiconductor pellets are pressed onto the paste. The bonding between the pellets and the lead frames are thus accomplished. The dispenser of a bonding machine that provides the lead frames with a paste has a syringe holder that holds a syringe, and the syringe holder is detachably mounted on a syringe mount of the dispenser.

The attachment of the syringe holder to the syringe mount of the dispenser is accomplished by directly fastening the syringe holder to the syringe mount by way of a plurality of, usually two, screws.

In such an attachment method, it is necessary to turn the plurality of screws when mounting and dismounting the syringe holder to the dispenser. This is troublesome, and it is impossible to quickly mount and dismount the syringe holder.

SUMMARY OF THE INVENTION

Accordingly, the object of the present invention is to provide a syringe holder attachment structure which allows a quick mounting and dismounting of the syringe holder to a syringe holder mount of a dispenser via an extremely simple operation.

In order to accomplish the object, the present invention takes a unique structure in a syringe holder attachment structure in which a syringe holder that holds a syringe is detachably mounted to a syringe holder mount, and the unique structure includes: at least two attachment holes opened in a syringe holder mount; a locking member provided in the syringe holder mount, the tip end of the locking member advancing into and withdrawing from one of the attachment holes in a direction perpendicular to the attachment hole, and the locking member being urged toward the attachment hole by means of a spring; at least two attachment pins provided on the syringe holder so as to be inserted into the attachment holes of the syringe holder mount; and an engagement recess formed in one of the attachment pins so that the tip end of the locking member can engage with this engagement recess to retain the syringe holder on the syringe holder mount.

With the structure described above, when the syringe holder is mounted, the locking member is pulled so that the tip end of the locking member is out of the attachment hole. Then, the attachment pins of the syringe holder are inserted into the attachment holes, and the locking member is brought back so as to advance by the driving force of the spring so that the tip end of the locking member engages with the engagement recess of the attachment pin. The syringe holder is thus securely mounted on the syringe holder mount of the dispenser.

BRIEF DESCRIPTION OF THE DRAWINGS

FIG. 1 is a front view of one embodiment of the syringe holder attachment structure according to the present invention;

FIG. 2 is a left side view thereof;

FIG. 3 is a top view thereof; and

FIG. 4 is a front view of the syringe holder mount used in the attachment structure.

DETAILED DESCRIPTION OF THE INVENTION

One embodiment of the present invention will be described with reference to FIGS. 1 through 4.

As shown in FIG. 4, a syringe holder mount 1 which is fastened to a dispenser of, for example, a bonding machine is provided with two attachment holes 1*a* and 1*b*.

An index plunger 2 is mounted to the syringe holder mount 1 in a direction perpendicular to the axial direction of the attachment hole 1*b*. The plunger 2 consists of a hollow screw member 3, a locking member 4 and a compression spring 5. The hollow screw member 3 is screwed into a locking hole of the syringe holder mount 1, the inner end of the locking hole being opened in the attachment hold 1*b*. The locking member 4 is inserted into the hollow section of the hollow screw member 3 so that the tip end 4*a* of the locking member 4 can advance into and withdraw from the attachment hole 1*b*. The compression spring 5 provided between the screw member 3 and the locking member 4 urges the locking member 4 toward the attachment hole 1*b*.

The hollow screw member 3 is tightened down by a lock nut 6 so that it does not loosen on the syringe holder mount 1. In addition, the screw member 3 has a stopper sleeve 3*a*. The stopper sleeve 3*a* is in contact with the end surface (left side surface in FIG. 4) of a knob 4*b* of the locking member 4 which is urged by the spring 5 toward the attachment hole 1*b*. Two projections 3*b* are formed in symmetrical positions (see FIG. 3) on this stopper sleeve 3*a*, and two grooves 4*c* are formed in the knob 4*b* of the locking member 4. The projections 3*b* and the grooves 4*c* are engageable with each other, and when they are engaged with each other, the rotation of the locking member 4 is prevented.

As shown in FIGS. 1 through 3, on a syringe holder 10 which is mounted to the syringe holder mount 1, two attachment pins 11 and 12 are provided. The pins 11 and 12 are brought into the attachment holes 1*a* and 1*b*, respectively, of the syringe holder mount 1. The attachment pin 12, which is below the pin 11, is provided with an engagement recess 12*a* that is engageable with the tip end 4*a* of the locking member 4.

A first inclination member 13 which adjusts the inclination of nozzles 41, that will be described later, in the Y direction (see FIG. 3) is disposed on the syringe holder 10. The first inclination member 13 is rotatable about a pin 14, that is installed in the syringe holder 10, and can be secured in place by a screw 15.

A first eccentric pin 16 used for inclination of the first inclination member 13 has an eccentric large-diameter portion and a small-diameter portion. The eccentric large-diameter portion of the eccentric pin 16 is inserted in a vertical slot 10*a* formed in the syringe holder 10, and the small-diameter portion of the pin 16 is attached to the first inclination member 13 in a rotatable fashion.

A second inclination member 20, which is L-shaped as seen in FIG. 1 for adjusting the inclination of the nozzles 41 in the X direction (see FIG. 3) and also for holding the bottom end of a syringe 40, is disposed on the first inclination member 13. The second inclination member 20 is rotatable about a pin 21, which is at right angles relative to the axis of the eccentric pin 16, and secured in place by a screw 22.

A second eccentric pin 23 used for adjusting the inclination of the second inclination member 20 has an eccentric large-diameter portion and a small-diameter portion. The eccentric large-diameter portion of the eccentric pin 23 is inserted in a vertical slot 20a formed in the second inclination member 20, and the small-diameter portion of the pin 23 is attached to the first inclination member 13 in a rotatable fashion.

A nozzle body 42 having nozzles 41 is fastened to the syringe-holding section 20b of the second inclination member 20 by a screw 24.

A first holder 30 for holding the upper end of the syringe 40 is disposed on the upper surface of the first inclination member 13 by screws 31. A second holder 32 which also holds the upper end of the syringe 40 is disposed on the first holder 30 via a pin 33. The second holder 32 is pivotal about the pin 33.

A screw 34 is fastened to the first holder 30, and the threaded portion 34a of the screw 34 is inserted in a screw hole 32a of the second holder 32. A nut 35 is screwed to the threaded portion 34a of the screw 34.

The operation of how the syringe holder 10 is mounted on the syringe holder mount 1 will be described below.

First, the syringe 40 is mounted to the syringe holder 10. With the screw 33 and the nut 35 loosened, the lower end 40a of the syringe 40 is inserted into the nozzle body 42, and the upper end of the syringe 40 is positioned between the first and second holders 30 and 32. Then, the nut 35 is turned so that the second holder 32 is pushed by the nut 35 and pivoted about the pin 33. As a result, the second holder 32 pushes the syringe 40 against the first holder 30, and the syringe 40 is held between the first and second holders 30 and 32, and then the screw 33 is tightened back. The syringe 40 is thus mounted on the syringe holder 10.

Next, with the syringe 40 mounted on the syringe holder 10, the syringe holder 10 is mounted to the syringe holder mount 1. First, the locking member 4 is pulled and turned 90 degrees to the left or right, releasing the engagement between the grooves 4c of the locking member 4 and the projections 3b of the hollow screw member 3. As a result, the tip end 4a of the locking member 4 is positioned out of the attachment hole 1b. This is shown by a broken line in FIG. 1. Under this state, the attachment pins 11 and 12 of the syringe holder 10 are brought into the attachment holes 1a and 1b of the syringe holder mount 1. Then, the locking member 4 is turned back 90 degrees, which results in that the locking member 4 is urged towards the attachment hole 1b (or to the right ward in FIG. 1) by the compression spring 5. As a result, the tip end 4a of the locking member 4 engages with the engagement recess 12a of the attachment pin 12. The spring 5 keeps the tip end 4a engaging with the recess 12a. Thus, the syringe holder 10 is mounted and retained on the syringe holder mount 1.

After the syringe holder is mounted, the inclination of the nozzles 41 is adjusted.

Adjustment of the inclination in the X direction is accomplished by loosening the screw 22 and turning the eccentric pin 23 in either direction. This causes the nozzle body 42 to rotate about the pin 21 together with the second inclination member 20. Thus, the inclination of the nozzles 41 in the X direction is adjusted since the nozzles 41 move together with the nozzle body 42.

Adjustment of the inclination in the Y direction is similarly accomplished by loosening the screw 15 and turning the eccentric pin 16 in either direction. This causes the first holder 30 to rotate about the pin 14 together with the first inclination member 13. Thus, the inclination of the nozzles 41 in the Y direction is adjusted.

In the embodiment described above, the syringe 40 is first mounted to the syringe holder 10, and then the syringe holder 10 with the syringe 40 thereon is mounted to the syringe holder mount 1. However, the syringe holder 10 can be first mounted to the syringe holder mount 1, so that the syringe 40 is mounted to the syringe holder 10 afterward.

Furthermore, the present invention is not limited to dropping of a paste. It is possible to use the present invention for dropping adhesives, solder cream, etc.

As is clear from the above description, the attachment of the syringe holder 10 to the syringe holder mount 1 can be accomplished merely by inserting the attachment pins 11 and 12 of the syringe holder 10 into the attachment holes 1a and 1b of the syringe holder mount 1 and then rotating the locking member 4 for 90 degrees. Accordingly, the syringe holder 10 can be mounted to the syringe holder mount 1 very quickly. When dismounting the syringe holder 10 from the syringe holder mount 1, it is only necessary to pull the locking member 4 (turn it for 90 degrees) and pull out the attachment pins 11 and 12 of the syringe holder 10. Accordingly, the dismounting of the syringe holder is very quick too.

According to the present invention, with the tip end of the locking member out of the attachment hole, the attachment pins of the syringe holder are inserted into the attachment holes and then the tip end of the locking member is brought via the spring to engage with the engagement recess of the attachment pin. This brings the syringe holder to be mounted on the syringe holder mount. Accordingly, attachment of the syringe holder to the syringe holder mount of a dispenser of, for example, a bonding machine, is very easy and quick with an extremely simple operation. In addition, dismounting of the syringe holder can also be accomplished very quickly by an extremely simple operation.

I claim:

1. A syringe holder attachment structure, in which a syringe holder holding a syringe is detachably mounted to a syringe holder mount, comprising: at least two attachment holes and a locking hole formed in said syringe holder mount; a locking member attached to said syringe holder mount and slidably provided in said locking hole, said locking member having a tip end that can advance into and withdraw from one of said at least two attachment holes in a direction perpendicular to said one of said at least two attachment holes and being driven toward said one of said at least two attachment holes by means of a spring projections provided adjacent said locking hole; recesses formed in said locking member for engagement with said projections; attachment pine fastened to said syringe holder, said pins being inserted into said attachment holes of said syringe holder mount; and an engagement recess formed in one of said attachment pins which is inserted into said attachment hole that corresponds to said locking member, a tip end of said locking member engaging with said engaging recess.

2. A syringe holder attachment structure comprising:

a syringe holder mount with a plurality of attachment holes and a locking hole, said locking hole being perpendicular to one of said attachment holes and one end thereof being opened in said one of attachment holes;

a screw member screwed into said locking hole, said screw member having a stopper sleeve that locates outside of said locking hole, and said stopper sleeve having projections;

a locking member disposed in said screw member so as to be movable in an axial direction thereof, said locking member having recesses which are engageable with said projections of said stopper sleeve;

a spring provided between said screw member and said locking member, said spring urging said locking member so that a tip end of said locking member stays in said one of attachment holes;

a syringe holder that holds a syringe, said syringe holder having a plurality of attachment pins which are inserted into said attachment holes of said syringe holder mount, one of said attachment pins being provided with a recess that is engaged with said tip end of said locking member, thus retaining said syringe holder on said syringe holder mount.

3. A syringe holder attachment structure according to claim 1, further comprising a plurality of nozzles for said syringe provided on said syringe holder, a first inclination member for adjusting the inclination of said plurality of nozzles in a Y direction and a second inclination member for adjusting the inclination of the plurality of nozzles in a X direction.

4. A syringe holder attachment structure according to claim 2, further comprising a plurality of nozzles for said syringe provided on said syringe holder, a first inclination member for adjusting the inclination of said plurality of nozzles in a Y direction and a second inclination member for adjusting the inclination of the plurality of nozzles in a X direction.

* * * * *